(12) United States Patent
Wong et al.

(10) Patent No.: US 7,023,740 B1
(45) Date of Patent: Apr. 4, 2006

(54) SUBSTRATE BIAS FOR PROGRAMMING NON-VOLATILE MEMORY

(75) Inventors: Nga-Ching Wong, San Jose, CA (US); Darlene G. Hamilton, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 65 days.

(21) Appl. No.: 10/755,979

(22) Filed: Jan. 12, 2004

(51) Int. Cl.
*G11C 16/04* (2006.01)

(52) U.S. Cl. ............................ 365/185.28; 365/185.18; 365/185.27

(58) Field of Classification Search ........... 365/185.27, 365/185.18, 185.28, 185.26, 185.01
See application file for complete search history.

(56) References Cited

U.S. PATENT DOCUMENTS

| | | | |
|---|---|---|---|
| 6,307,781 B1 * | 10/2001 | Shum | 365/185.17 |
| 6,493,262 B1 * | 12/2002 | Wald et al. | 365/185.15 |
| 6,628,544 B1 * | 9/2003 | Shum et al. | 365/185.03 |
| 6,909,139 B1 * | 6/2005 | Shum et al. | 257/315 |
| 2003/0218908 A1 * | 11/2003 | Park et al. | 365/185.16 |

* cited by examiner

*Primary Examiner*—Gene N. Auduong

(57) ABSTRACT

A method and system for substrate bias for programming non-volatile memory. A bias voltage is applied to a deep well structure under a well comprising a channel region for a non-volatile memory cell. During programming, a negative bias applied to the deep well beneficially creates a non-uniform distribution of electrons within the channel region, with an abundance of electrons at the surface of the channel region. The application of additional bias voltages to a control gate and a drain may cause electrons to migrate from the channel region to a storage layer of the non-volatile memory cell. Advantageously, due to the increased supply of electrons at the surface of the channel region, programming of the non-volatile cell takes place faster than under the conventional art.

13 Claims, 4 Drawing Sheets

SUBSTRATE BIAS FOR PROGRAMMING NON-VOLATILE MEMORY

TECHNICAL FIELD

Embodiments of the present invention relate to design and operation of sub-micron metal oxide semiconductors. More particularly, embodiments of the present invention provide a substrate bias for programming non-volatile memory.

BACKGROUND ART

Flash memory is a type of semiconductor computer memory with many desirable characteristics. Like read only memory, ROM, it is non-volatile, meaning that the contents of the memory are stable and retained without applied electrical power.

Flash memory devices have found wide commercial success in the electronic device market. A major advantage of flash over ROM is that the memory contents of flash may be changed after the device is manufactured. Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

FIG. 1 shows a memory cell 10 as has been well known in the conventional art. Regions 14 are the drain and/or source regions for memory cell 10. They may be used as source and/or drain interchangeably. Control gate 16 is used to control the operation of memory cell 10. A channel region 17 is formed between source/drain regions 14. Feature size 18 is the nominal size of the smallest feature that can be created by a particular semiconductor process. In memory cells of this type, the gate 16 width and channel 17 length typically correspond approximately to feature size 18.

Memory cell 10 may be one of two general types of non-volatile memory, a "floating gate" cell or a nitride read only memory (NROM) cell. In a floating gate cell, layer 12B of the gate stack is typically conductive polysilicon. Layers 12A and 12C are insulating materials which isolate or "float" gate layer 12B, which is usually referred to as a floating gate. Floating gate 12B is the storage element of memory cell 10.

Silicon nitride based flash memory has many advantages as compared to its floating gate and tunneling oxide based counterparts. Silicon-Oxide-Nitride-Oxide-Silicon (SONOS) is potentially very dense in terms of number of cells per unit area that can be used and it requires fewer process steps as compared to floating gate memory. Moreover, it can be easily integrated with standard SRAM process technology. A further advantage of using SONOS devices is their suitability for applications requiring large temperature variations and radiation hardening. The SONOS stack is a gate dielectric stack and consists of a single layer of polysilicon, a triple stack ONO (Oxide-Nitride-Oxide) gate dielectric layer and a MOS channel 17. The ONO structure may consist of a tunnel oxide 12A, a nitride memory storage layer 12B and a blocking oxide layer 12C.

Flash memory devices are typically configured as an array of many instanced of individual cells, e.g., cell 10, oriented in rows and columns. Typically, the control gates, e.g., control gate 16 of FIG. 1, of the cells in each row are connected to a series of word lines, thus forming individual rows of cells that can be accessed by selecting the corresponding word line. Similarly, the source and/or drain, e.g., regions 14, of the cells in each column are connected to a series of bit lines, thus forming individual columns of cells that can be accessed by selecting the corresponding bit lines.

Memory device manufacturers are continually challenged to provide ever greater amounts of memory at ever lower costs. Recently, Advanced Micro Devices, Incorporated of California has introduced MIRROR BIT™ nitride-based flash ROM that stores multiple bits per memory cell 10 physically separated in nitride layer 12B. Such storage of multiple bits per cell increases the storage density of the memory device, thereby reducing the cost per bit of storage.

To read a bit stored in the "left" portion of memory cell 10, a word line is brought to a read voltage of about 4.5 volts and a bit line is grounded. Node 14A (the "left" instance of regions 14) functions as a source for the cell, and current flows from node 14B, acting as a drain, to node 14A through a bit line to ground. Sensing logic connected to the bit line can interpret the magnitude of the current (which is affected by the amount of charge stored in nitride gate layer 12B) in order to determine if a bit is stored in the "left" portion of cell 10.

To read a bit stored in the "right" portion of memory cell 10, a word line is brought to a read voltage of about 4.5 volts and a bit line is grounded. Node 14B (the "right" instance of regions 14) functions as a source for the cell, and current flows from node 14A, acting as a drain, to node 14B through a bit line to ground. Sensing logic connected to the bit line can interpret the magnitude of the current (which is affected by the amount of charge stored in nitride gate layer 12B) in order to determine if a bit is stored in the "right" portion of cell 10.

To write (or program) a bit into the "right" portion of memory cell 10, a line is brought to a programming voltage of about 9.5 volts, and a bit line is grounded and acts as a source. Current is sourced from the word line through node 14A into bit line. The current causes hot carrier injection of charge into the nitride layer of the SONOS stack in physical proximity to node 14A.

To write (or program) a bit into the "left" portion of memory cell 10, a line is brought to a programming voltage of about 9.5 volts, and a bit line is grounded and acts as a source. Current is sourced from the word line through node 14B into bit line. The current causes hot carrier injection of charge into the nitride layer of the SONOS stack in physical proximity to node 14B.

However, flash memory generally can not be written to, or programmed, at rates comparable to random access memory, RAM, or at rates directly compatible with a computer system's processing unit. Consequently, the benefits of flash, e.g., changeable non-volatile storage, demand a deleterious decrease in write performance of the memory subsystem. In addition, as most computer systems utilizing flash memory also employ RAM, the complexities of managing the differing timing requirements between flash and RAM are an undesirable burden on system designers seeking to utilize flash memory. Further, flash generally must be erased, either in its entirety or in large segments called pages, prior to changing its contents. Erasing a flash device, or a portion of a flash device, is generally a long process, typically measured in hundreds of milliseconds. This is a disadvantage compared to RAM and hard drives, which may be written directly, without an interposing erasure.

There have been numerous techniques employed in the conventional art to improve either the actual or apparent programming/write speed of flash memory. For example, segments of a flash memory device may be pre-erased so that the portion(s) are erased and ready to be programmed immediately when desired. An approach used to hide the programming time required for flash memory increases the apparent write speed of flash memory by caching write data into a RAM buffer, and utilizing a background process to actually erase and/or program the flash memory. This is a conventional function of software commonly known as a "flash file system."

In another conventional attempt mitigate the write speed disadvantage of flash, some flash devices are capable of partial page programming. Partial page programming is a technique whereby some of the contents of a page of flash memory may be updated without erasing. Typically, a cell of flash memory is described as being either in the erased state or the programmed state. Either state, programmed or erased, may be arbitrarily assigned the binary value 0, and the other state may be assigned the binary value 1.

Assuming the erased state is assigned the binary value 1, partial page programming generally allows, for example, instances of 1 in the programmed page to be changed to a value of 0, without an intervening erase process. In general, cells programmed to a value of 0 may not be changed to a 1 value. Changing a cell from a 0 to a 1 typically requires the page or block erase process.

Many of these conventional approaches to increasing the write performance of flash memory rely primarily on software-implemented processes to manage flash storage. The use of additional software, e.g., a flash file system, may be undesirable as it increases the computational load of a host processor, and generally requires additional storage, both for buffers and other data tables required to implement the processes as well as for software code storage. In many computer systems, especially hand held computer systems, the cost of such increased storage may be burdensome. Further, the increased complexity of memory accesses contributes to memory storage errors and an undesirable increased development effort on the part of the designers.

Semiconductor processing equipment is extremely expensive. Fundamental semiconductor processing steps, e.g., implantation and diffusion, typically require long periods of development and extensive qualification testing. Implementing a new fabrication process requires considerable resources on the part of the semiconductor manufacturer. A manufacturer may have to alter or entirely revamp process libraries and process flows in order to implement a new fabrication process. Additionally, re-tooling a fabrication line is very expensive, both in terms of direct expenses as well as in terms of opportunity cost due to the time required to perform the re-tooling. Consequently, any solution to increase the rate of flash programming should be compatible with existing semiconductor processes and equipment without the need for revamping well established tools and techniques.

Accordingly, a need exists to increase the programming speed of flash memory. A further need exists for increasing the programming speed of flash memory in a manner that is compatible and complimentary with conventional approaches to increase the programming speed of flash memory. A still further need exists for the above mentioned needs to be achieved with existing semiconductor processes and equipment without revamping well established tools and techniques.

DISCLOSURE OF THE INVENTION

Embodiments of the present invention provide a means to increase the programming speed of flash memory. Further embodiments of the present invention provide for increasing the programming speed of flash memory in a manner that is compatible and complimentary with conventional approaches to increase the programming speed of flash memory. Still further embodiments of the present invention provide for the above mentioned solutions to be achieved with existing semiconductor processes and equipment without revamping well established tools and techniques.

A method and system for substrate bias for programming non-volatile memory is disclosed. A bias voltage is applied to a deep well structure under a well comprising a channel region for a non-volatile memory cell. During programming, a negative ve bias applied to a device with deep n-well, p-well and n-channel transistors beneficially creates a non-uniform distribution of electrons within the channel region, with an abundance of electrons at the surface of the channel region. The application of additional bias voltages to a control gate and a drain may cause electrons to migrate from the channel region to a storage layer of the non-volatile memory cell. Advantageously, due to the increased supply of electrons at the surface of the channel region, programming of the non-volatile cell takes place faster than under the conventional art.

BEST MODE FOR CARRYING OUT THE INVENTION

In the following detailed description of the present invention, substrate bias for programming non-volatile memory, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Substrate Bias for Programming Non-Volatile Memory

Embodiments of the present invention are described in the context of design and operation of flash memory devices. However, it is appreciated that embodiments of the present invention may be utilized in other areas of electronic design and operation.

Figure 2:
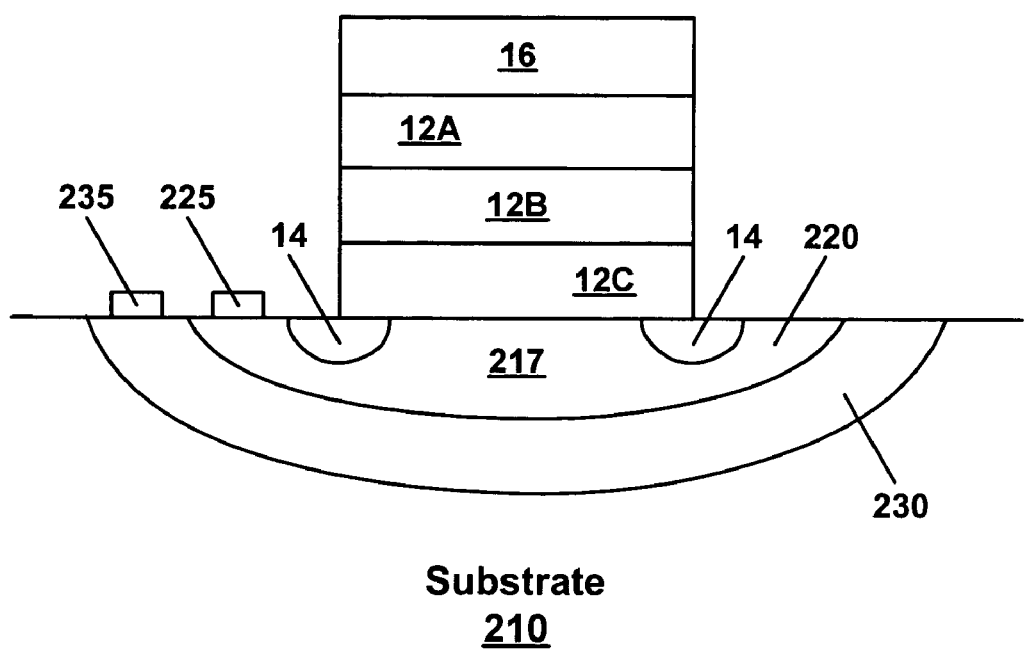
FIG. 2 illustrates a non-volatile memory cell, according to an embodiment of the present invention.

FIG. 2 illustrates a non-volatile memory cell 200, according to an embodiment of the present invention. Regions 14 are the drain and/or source regions for memory cell 200. They may be used as source and/or drain interchangeably.

Control gate 16 is used to control the operation of memory cell 200. A channel region 217 is formed between source/drain regions 14.

Memory cell 200 may be one of two general types of non-volatile memory, a "floating gate" cell or a nitride read only memory (NROM) cell. In a floating gate cell, layer 12B of the gate stack is typically conductive polysilicon. Layers 12A and 12C are insulating materials which isolate or "float" gate layer 12B, which is usually referred to as a floating gate. Floating gate 12B is the storage element of memory cell 10.

Alternatively, memory cell 200 may be silicon nitride based flash memory cell, according to an embodiment of the present invention. NROM has many advantages as compared to its floating gate and tunneling oxide based counterparts. Silicon-Oxide-Nitride-Oxide-Silicon (SONOS) is potentially very dense in terms of number of cells per unit area that can be used and it requires fewer process steps as compared to floating gate memory. Moreover, it can be easily integrated with standard SRAM process technology. A further advantage of using SONOS devices is their suitability for applications requiring large temperature variations and radiation hardening. The SONOS stack is a gate dielectric stack and consists of a single layer of polysilicon, a triple stack ONO (Oxide-Nitride-Oxide) gate dielectric layer and a MOS channel 217. The ONO structure may consist of a tunnel oxide 12A, a nitride memory storage layer 12B and a blocking oxide layer 12C.

The silicon substrate 210 upon which structures of non-volatile memory cell 200 may be constructed is typically P-type material. In a conventional non-volatile memory cell, for example memory cell 10 (FIG. 1), substrate 210 may also form a channel region of P-type material. In memory cell 200, a deep well 230 of, for example, N-type material may be formed by well known processes, for example a high energy implant of N-type material. Another well 220 of, for example, P-type material is formed within deep well 230. Well 220 provides P-type material for channel region 217. Deep well 230 has an electrical contact 235, and well 220 has an electrical contact 225. It is appreciated that electrical contacts 235 and 225 are illustrative, and that embodiments of the present invention are well suited to various well known configurations of contacts.

Programming, or writing, cell 200 comprises changing the charge state of storage layer 12B, according to an embodiment of the present invention. More particularly, cell 200 is said to be programmed when layer 12B has an excess of negative charges, or electrons. In order to create an excess of electrons on storage layer 12B, a first bias voltage V1 240 is applied to control gate 16. Bias voltage V1 240 may be, for example, approximately 9.5 volts. A second bias voltage V2 244 is applied to region 14B acting as a drain for memory cell 200. Bias voltage V2 244 may be, for example, approximately 4.5 volts. Region 14A, acting as a source for memory cell 200 may be grounded.

Figure 1:
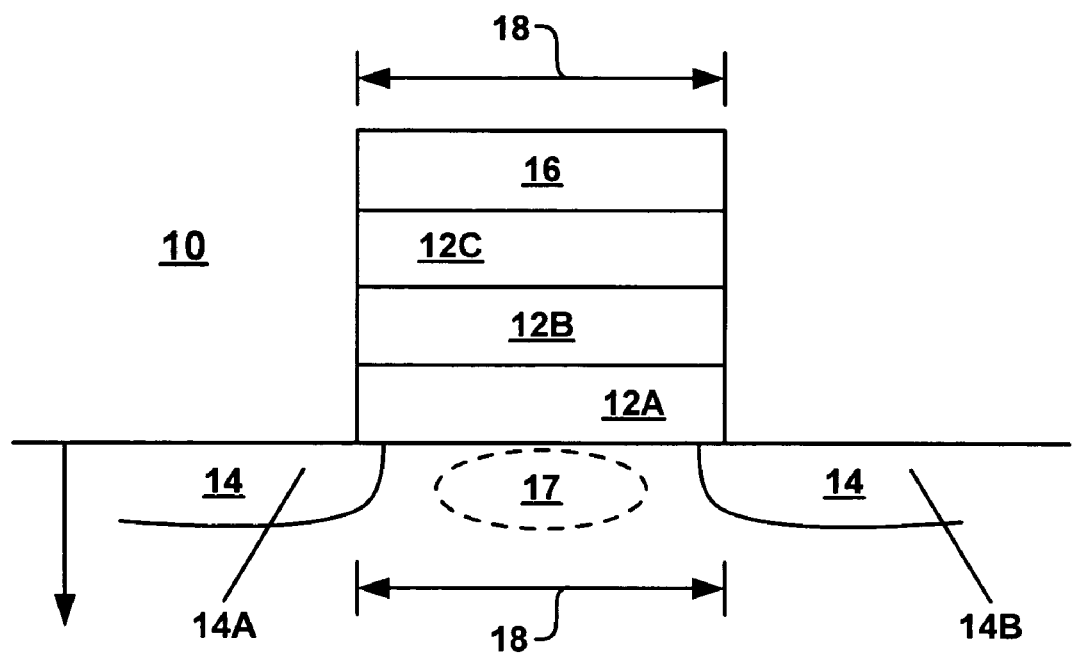
FIG. 1 shows a memory cell as has been well known in the conventional art.

In one embodiment of the present invention, well 220 and deep well 230 may be grounded. In this configuration, programming of cell 200 is similar to programming of cell 10 (FIG. 1). Electrons are attracted toward positively biased control gate 16. Through a non-conductive transport mechanism, for example, hot electron injection, electrons migrate from channel region 217 to storage layer 12B. Preferably, variables, for example, first bias voltage V1 240, second bias voltage V2 244 and time, may be controlled such that a desired amount of negative charge accumulates on storage layer 12B.

Figure 3:
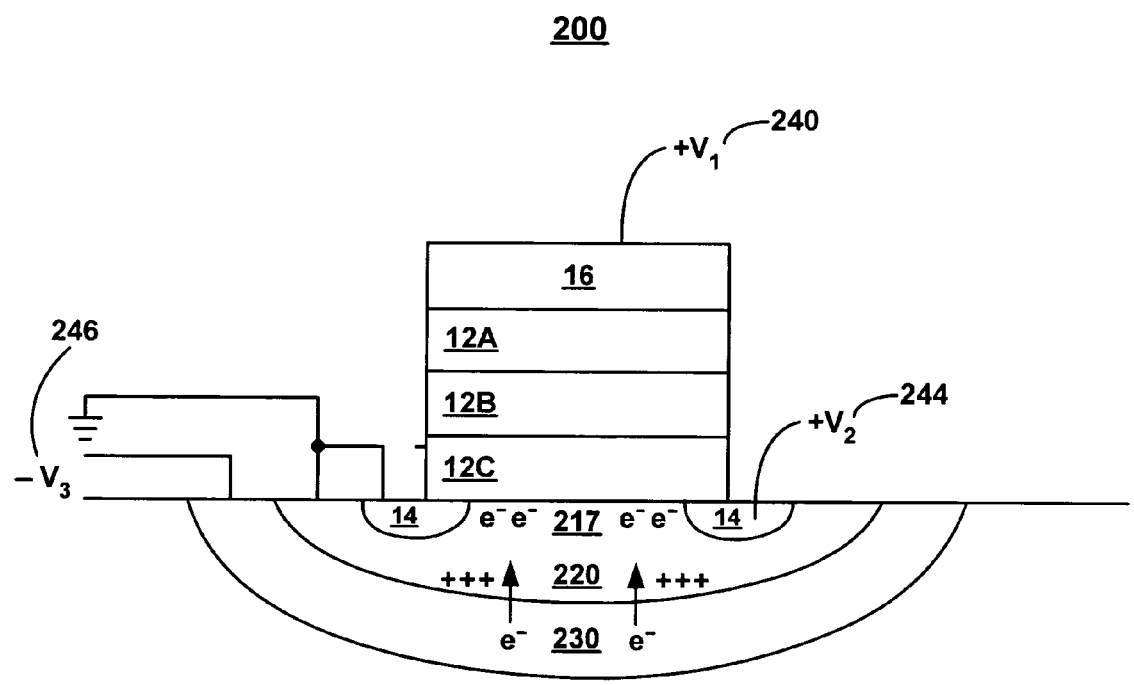
FIG. 3 illustrates programming of a non-volatile memory cell, according to an embodiment of the present invention.

FIG. 3 illustrates programming of non-volatile memory cell 200, according to an embodiment of the present invention. As described previously, well 200 may be grounded. If a negative bias voltage 246 is applied to deep well 230, electrons will migrate from deep well 230 to well 220. Additionally, electrons within well 220 will be electrostatically repelled from regions near the junction of well 220 and deep well 230. Both the migration and repulsion mechanisms increase the supply of electrons in channel region 217. More particularly, for comparable bias conditions V1 240 and V2 244, the application of negative bias voltage 246 to deep well 230 causes channel region 217 to have a richer supply of electrons when compared to the previously described embodiment or when compared to the conventional configuration of memory cell 10.

As a beneficial result of such a richer supply of electrons in channel region 217, programming duration may be advantageously reduced compared to conventional memory cell 10. As discussed previously, a reduction in programming time is a highly sought-after improvement in the operation of a flash memory, which may be based upon cell 200.

Most low power flash memory devices operate, e.g., read and program, on a single external voltage supply, for example three volts. Internal voltages, e.g., first bias voltage V1 240 and second bias voltage V2 244 are typically generated by auxiliary circuits, for example, a charge pump, on a flash memory integrated circuit. Such circuits are complex and time consuming to develop. Further, the efficiency of such on-chip voltage converters generally detrimentally decreases as the difference between source voltage, e.g., a 3 volt external supply, and output, e.g., first bias voltage V1 240 of 9.5 volts, increases.

Consequently, it is generally not desirable to increase the number of operating voltages used with memory cell 200. While increasing first bias voltage V1 240 might decrease the time required to program cell 200, the impact of increasing the internal bias voltages is generally not commercially acceptable. Further, first bias voltage V1 240 is already a high voltage with respect to the semiconductor structures. Additional increases in such voltages may lead to decreased reliability and/or increased failure rates of memory cell 10, due to, for example, a breakdown of a dielectric layer.

It is to be appreciated that embodiments of the present invention are well suited to a storage layer comprised of a conductive material or nitride.

Figure 4:
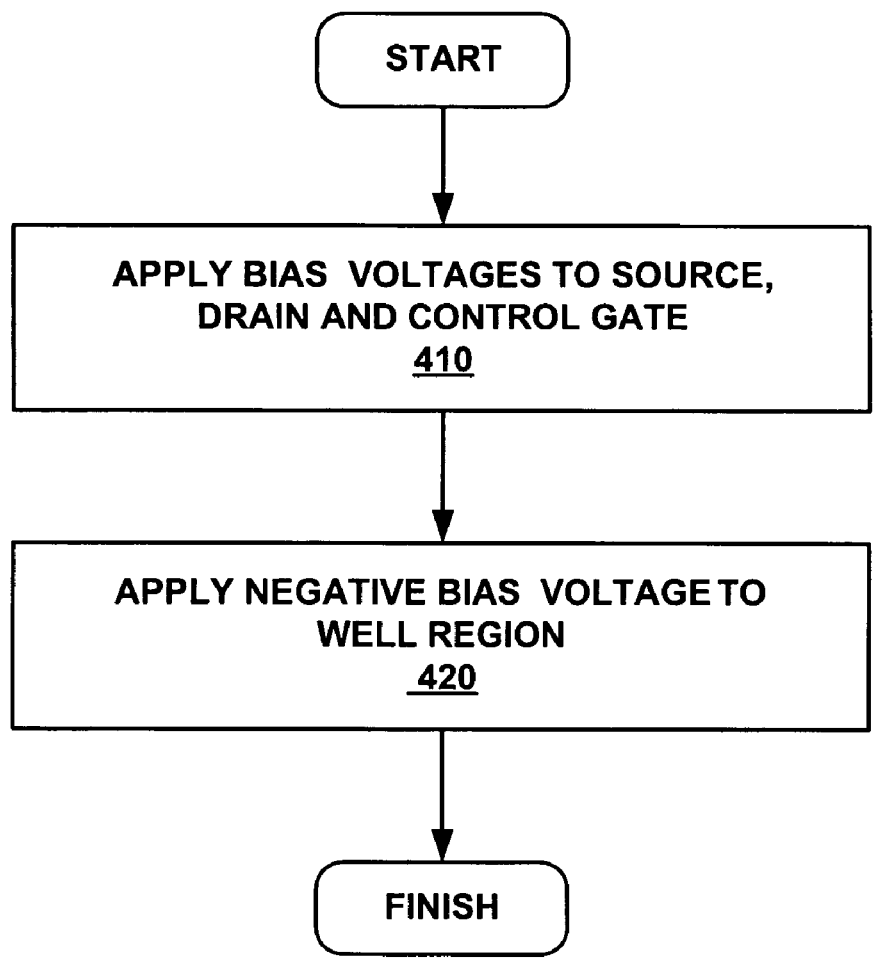
FIG. 4 is a flow chart illustrating a method for programming a non-volatile memory cell, according to an embodiment of the present invention.

FIG. 4 is a flow chart illustrating a method 400 for programming a non-volatile memory cell, according to an embodiment of the present invention.

In step 410, a first bias voltage is applied to a source, a second bias voltage is applied to a drain and a third bias voltage is applied to a control gate of a non-volatile memory cell, for example, non-volatile memory cell 200. The first, second and third bias voltages are configured to program the memory cell. More particularly, the bias voltages cause electrons to migrate to a storage layer of the non-volatile memory cell.

In step 420, a negative bias voltage is applied to a well region, for example deep well 230, of the memory cell. The well region is substantially under a channel region of the memory cell.

It is to be appreciated that embodiments of the present invention are well suited to a variety of sequences of application of the bias voltages described in method 400. For example, all voltages could be applied substantially simultaneously. The illustration of method 400 in a flow chart is intended to be illustrative. However, the implied sequential nature of a flowchart is not intended to limit embodiments of the present invention to sequential methods.

The novel application of a bias voltage to a well region described herein may also be beneficial during erase operations. As previously described, flash memory generally requires an erase operation prior to programming/writing. This required erase operation is a disadvantage of flash memory as opposed to random access memory, or even magnetic memory, which do not require a separate erase operation.

An erase operation on non-volatile memory cell 200 may be viewed as eliminating an excess negative charge from storage layer 12B. A negative charge on storage layer 12B may be removed or neutralized.

In order to remove negative charge from storage layer 12B, electrons must be removed from storage layer 12B. Application of a positive bias voltage to deep well 230, such that well 220 is at a lower potential than deep well 230, will create a non-uniform distribution of charge in well 220, with electrons attracted to the 220/230 junction. Consequently, channel region 217 will be relatively depleted of electrons, and the electrons stored on storage layer 12B may be enticed to jump to channel region 217. It is to be appreciated that other bias conditions, for example a negative bias of −6 volts to −8 volts on control gate 16, may also be required to erase non-volatile memory cell 200.

In order to add positive charge to storage layer 12B, which may neutralize a pre-existing negative charge on storage layer 12B, positive charge must be added to storage layer 12B. Application of a positive bias voltage to deep well 230, such that well 220 is at a lower potential than deep well 230, will create a non-uniform distribution of charge in well 220, with electrons attracted to the 220/230 junction. Consequently, channel region 217 will be relatively depleted of electrons, and relatively rich in positive charge. Positive charge carriers may be enticed to jump from channel region 217 to storage layer 12B. It is to be appreciated that other bias conditions, for example a negative bias of −6 volts to −8 volts on control gate 16, may also be required to erase non-volatile memory cell 200.

The novel application of a negative bias voltage to a well region in conjunction with a programming configuration of bias voltages beneficially increases the supply of electrons for programming and consequently produces an advantageous increase in programming rate for the memory cell.

This novel design and method to implement substrate bias for programming non-volatile memory enable increased programming rates and decreased programming times for non-volatile memory. These beneficial results allow for less improved memory subsystem performance, rendering a competitive advantage to the users practicing embodiments of the present invention.

Embodiments of the present invention provide a means to increase the programming speed of flash memory. Further embodiments of the present invention provide for increasing the programming speed of flash memory in a manner that is compatible and complimentary with conventional approaches to increase the programming speed of flash memory. Still further embodiments of the present invention provide for the above mentioned solutions to be achieved with existing semiconductor processes and equipment without revamping well established tools and techniques.

The preferred embodiment of the present invention, substrate bias for programming non-volatile memory, is thus described. While the present invention has been described in particular embodiments, it should be appreciated that the present invention should not be construed as limited by such embodiments, but rather construed according to the below claims.

What is claimed is:

1. A method of programming a non-volatile memory cell comprising:
    applying a first bias voltage to a source, a positive second bias voltage to a drain and a positive third bias voltage to a control gate of said memory cell to program said memory cell; and
    applying a negative fourth bias voltage to a deep well region of said memory cell, wherein said deep well region is substantially under a channel region of said memory cell, and wherein said deep well region comprises a dominant charge carrier of a different type than said channel region.

2. The method as described in claim 1 wherein said channel region comprises P-type material and wherein said well region comprises N-type material.

3. The method as described in claim 1 wherein said method further comprises grounding said channel region.

4. The method as described in claim 1 wherein said first bias voltage is substantially ground.

5. The method as described in claim 1 wherein said third bias voltage is greater than said second bias voltage.

6. The method as described in claim 1 wherein said memory cell comprises a floating gate as a storage element.

7. The method as described in claim 1 wherein said memory cell comprises a nitride layer as a storage element.

8. The method as described in claim 1 wherein said memory cell stores more than one bit of information.

9. A method of programming a non-volatile memory cell comprising:
    applying a negative bias voltage to a deep well region of said memory cell to inject electrons into a channel region of said memory cell, wherein said deep well region is substantially under said channel region of said memory cell, and wherein said deep well comprises a dominant charge carrier of a different type than said channel region; and
    biasing a drain and a control gate of said memory cell to cause electrons to migrate from said channel region to an electrically isolated storage layer of said memory cell.

10. The method of programming a non-volatile memory cell as described in claim 9 further comprising biasing a source of said memory cell.

11. The method of programming a non-volatile memory cell as described in claim 9 further comprising biasing a channel region of said memory cell.

12. The method of programming a non-volatile memory cell as described in claim 9 wherein said electrically isolated storage layer of said memory cell comprises conductive material.

13. The method of programming a non-volatile memory cell as described in claim 9 wherein said electrically isolated storage layer of said memory cell comprises nitride.

* * * * *